TUNING CIRCUIT DRIVE MECHANISM

Filed April 20, 1966 2 Sheets-Sheet 1

INVENTOR.
John T. Ludeke

BY Hill, Sherman, Meroni, Gross & Simpson ATTORNEYS

TUNING CIRCUIT DRIVE MECHANISM

Filed April 20, 1966 2 Sheets-Sheet 2

INVENTOR.
John T. Ludeke

BY Hill, Sherman, Meroni, Gross & Simpson ATTORNEYS

United States Patent Office
3,497,810
Patented Feb. 24, 1970

3,497,810
TUNING CIRCUIT DRIVE MECHANISM
John T. Ludeke, Quincy, Ill., assignor to Gates Radio Company, Quincy, Ill., a corporation of Illinois
Filed Apr. 20, 1966, Ser. No. 543,910
Int. Cl. H04b *1/06*
U.S. Cl. 325—172 3 Claims

ABSTRACT OF THE DISCLOSURE

An output tuning system for a radio frequency transmitter including a pair of tuning capacitors having plunger type adjustment arms and a tuning coil having a rotatably mounted adjustment arm. The adjustment arms of the capacitors and coil are coupled by a series of drive shafts having cam profiles fixedly mounted thereon for adjusting the capacitance of the tuning capacitors. A single drive shaft means rotates the cam profiles and tunes the coil to maintain a timed electrical relationship between the tuning coil and the capacitors for all selectable broadcast frequencies.

This invention relates to a tuning circuit drive mechanism and, in particular, relates to a tuning device for automatically matching the capacitive and inductive components in the output tuning circuit of a radio frequency transmitter.

Radio frequency transmitters generally employ a pi- or a pi-L type output network which is resonant at the broadcast frequency and which thereby emphasizes the selected broadcast signal and de-emphasizes suprious and harmonic components of the broadcast signal. If the transmitter broadcast frequency is constant, the values of the capacitive and inductive components comprising the output-tuned circuit may likewise be constant and will usually be preset at an optimum matched relationship. The capacitive and inductive components are said to be matched when a network yields a maximum output signal at the broadcast frequency. This condition is characteristically referred to as resonance.

If, however, the broadcast frequency of the transmitter is variable, the values of the capacitive and inductive components of the out-tuned circuit must be adjusted to reestablish resonance at each selected broadcast frequency. This invention concerns the simultaneous adjustment of these components.

The capacitive and inductive elements that comprise the output-tuned circuit of a radio frequency transmitter are mechanical, as well as electrical, devices. Accordingly, a linear change in electrical properties may require, for instance, a non-linear change in a mechanical adjustment. Also, the degree of mechanical adjustment required to alter the capacitance of a tuning capacitor may be quite distinguishable from the degree of mechanical adjustment equired to effect a change in the industance of a tuning coil.

Heretofore, the tuning of output transmitter tuning circuits has been accomplished by individually adjusting the reactive elements in order to establish an optimum matched relationship for those elements at the given broadcast frequency. However, such tuning could only be accomplished by a skilled technician and therefore was usually done by the manufacturer under the specification that the transmitter would be used at a given single broadcast frequency. However, with the employment of a variable frequency broadcast system, it became necessary to develop a tuning circuit drive mechanism which was capable of simultaneously adjusting all the tuning elements according to a single selection from a spectrum of possible broadcast frequencies.

Accordingly, the principal object of this invention is to provide a tuning circuit drive mechanism for automatically adjusting the reactive components of a transmitter output-tuning circuit.

It is also an object of this invention to provide a drive mechanism for an output-tuning circuit of a variable freqency transmitter wherein a first drive shaft segment is provided with a cam profile for adjusting the capacitance of a tuning capacitor and wherein a second drive shaft segment is rotatably linked to a rotary adjustment arm of an asociated tuning coil.

It is a further object of this invention to provide an output-tuning system for a variable frequency transmitter which includes a tuning capacitor having a plunger-type adjustment arm, a tuning coil having a rotary-type adjustment arm and a drive mechanism which includes a cam profile having a radius at all adjustment angles which is predetermined to match the capacitance of the tuning capacitor to the inductance of the tuning coil and wherein the rotation of the cam profile is geared to the rotation of the tuning coil adjustment arm for being operated by a single drive motor.

It is an additional object of this invention to provide an output-tuning system for a variable frequency transmitter which includes a plurality of tuning capacitors and a tuning coil wherein each of the tuning capacitors is provided with an individualized cam profile for simultaneously matching the adjustment of one of the reactive elements in the tuning circuit to the adjustment of the remaining reactive elements.

These and other objects, features and advantages of the present invention will be understood in greater detail from the following description and the associated drawings wherein reference numerals are utilized in designating an illustrative embodiment and wherein.

In a variable frequency transmitter, means must be provided for adjusting the output-tuning circuit to provide maximum performance for the selected broadcast frequency. The output-tuning circuit is provided to be substantially resonant at the broadcast frequency and, accordingly, as the broadcast frequency is varied, the resonant point must likewise be varied by adjusting the effective values of the reactive components comprising the tuning circuit. Furthermore, while a tuned output circuit can be maintained in a tuned relationship for various broadcast frequencies by adjusting only one of the reactive elements, optimum performance and maximum efficiency of the output-tuning network can be accomplished only by suitable adjustments of all principal reactive elements in the tuned network.

The mechanical adjustment of the cooperative reactive components of an output-tuning circuit falls in an irregular pattern in order to maintain optimum conditions. For example, a change in the broadcast frequency may require an adjustment of the tuning coil which is wholly unrelated in a mechanical sense to the required adjustment of the associated tuning capacitor. In addition, a similar further change in frequency may require a dissimilar change in both the tuning coil and tuning capacitor adjustments. Nevertheless, this invention provides a single drive adjustment means for simultaneously adjusting the tuning capacitor and the associated tuning coil in response to any selected frequency within a given frequency spectrum.

Figure 1:
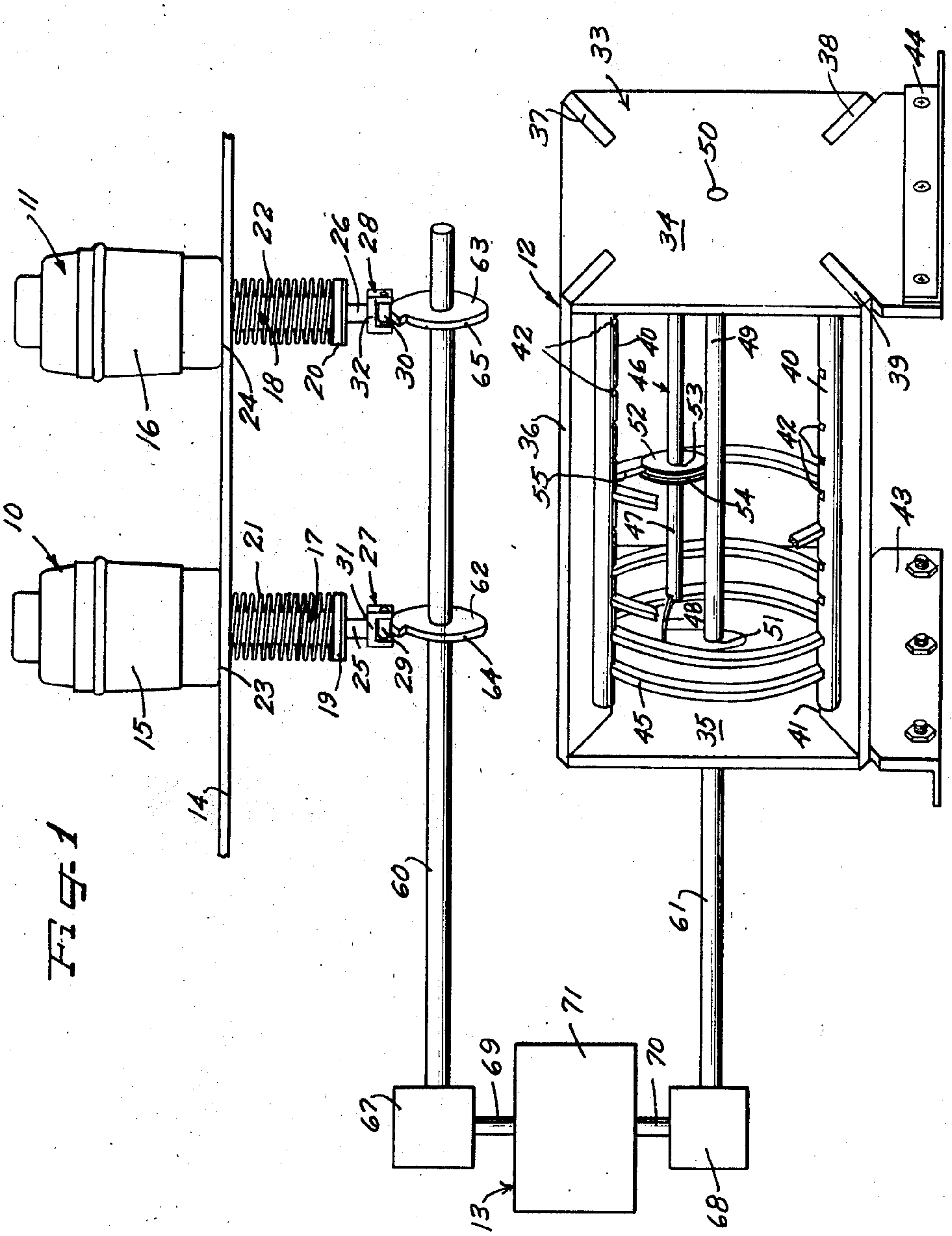
FIG. 1 is a schematic illustration showing the mechanical orientation of the reactive components comprising an output-tuning circuit according to this invention.

In FIG. 1, an illustrative embodiment of this invention is shown to comprise first and second tuning capacitors 10 and 11, and an associated tuning coil 12. A tuning circuit drive mechanism 13 is employed to simultaneously match the capacitance of the tuning capacitors 10 and 11 to the inductance of the tuning coil 12 for the purpose of presenting the proper circuit impedance to a selected broadcast frequency.

The tuning capacitors 10 and 11 may be of the vacuum type and are mounted at a bracket 14 which, in turn, is fixedly secured to the chassis of a radio frequency transmitter employing the tuning output circuit of FIG. 1. The capacitors 10 and 11 have casings or housings 15 and 16 and extensible plunger-type adjustment arms 17 and 18. Spring guides 19 and 20 are fixedly mounted on the plunger-type arms 17 and 18, and coil springs 21 and 22 are disposed between the lower surfaces 23 and 24 of the capacitors 10 and 11.

The lower ends 25 and 26 of the plunger-type adjustment arms 17 and 18 are provided with cam followers 27 and 28 which include roller-type bearings 29 and 30 rotatably mounted within associated brackets 31 and 32.

The value of capacitance presented by the tuning capacitors 10 and 11 is varied by longitudinal or axial movement of the plunger-type adjustment arms 17 and 18. In order to maintain an optimum output tuning impedance for a given broadcast frequency, it may be required to adjust the axial position of the adjustment arms 17 and 18 in an irregular pattern for the purpose of matching the inductance of the tuning coil 12 to the reactive combination of the elements 10, 11 and 12.

The tuning coil 12 comprises a coil bracket 33 which includes end supports 34 and 35 as well as a series of longitudinal supports 36, 37, 38 and 39. The longitudinal supports 36 through 39 are provided with insulating members 40 which are rigidly secured at the inner edge 41 of each of the longitudinal supports 36 through 39. A plurality of properly spaced slots 42 are formed in each of the insulating members 40 for receiving the tuning coil structure. The entire tuning coil assembly 12 is provided with support brackets 43 and 44 for mounting the assembly on the radio frequency transmitter chassis.

An inductance winding 45 is mechanically spiralled in such a manner as to be received and supported within the series of slots 42 formed transversely of the insulating members 40. The winding 45 may be irregularly spaced so that the winding is more closely wound at one end of the coil than at the other end for the purpose of obtaining improved frequency adjustment control.

The inductance winding 45 is adjusted through the provision for a rotary adjustment mechanism 46 which comprises a slide rod 47 and a support arm 48. An axle 49 extends from the first end support 34 to the second end support 35 and is rigidly mounted at the point 50. The rotary adjustment arm 46 is pivotally supported as at 51 to the support axle 49 and may be freely rotated about that axle.

Figure 2:
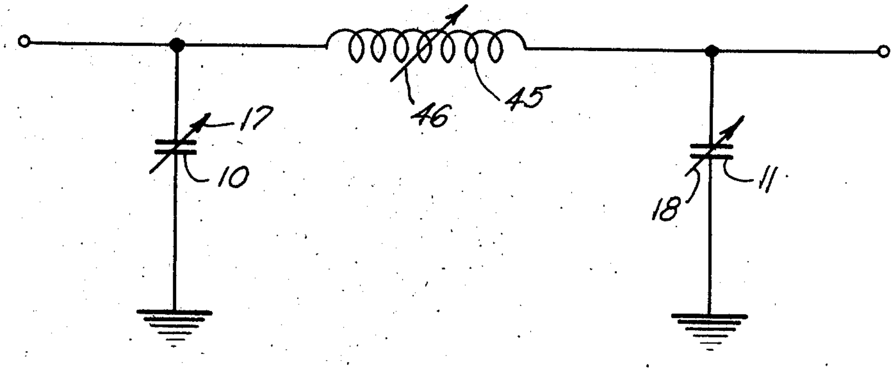
FIG. 2 is a circuit diagram illustrating the electrical relationship of the reactive components shown in FIG. 1.

The inductance of the tuning coil 12 is varied through the use of an adjustment wheel 52 which is rotationally mounted at the slide rod 47 as at the point 53. The adjustment wheel 52 is provided with a circumferential slot 54 which receives the inner edge 55 of the tuning coil 45. The bearing surfaces between the wheel 52 and the coil 45, between the wheel 52 and the slide rod 47, and between the support arm 48 and the axle 29, are provided to be continuous electrical connections. Accordingly, by rotating the rotary adjustment arm 46, the adjustment wheel 52 will be caused to follow the inner surface or inner edge 55 of the coil 45 and simultaneously to slide along the slide rod 47 for the purpose of varying the effective inductance of the tuning coil. Therefore, if a first end of the winding 45 and a lead wire from the axle 49 are connected in circuit combination with the tuning capacitors 10 and 11, as shown in FIG. 2, the effective inductance of the tuning coil 12 will be determined by the angular position of the rotary adjustment arm 46. It is apparent from FIG. 1 that several complete revolutions of the adjustment arm 46 may be effected in order to alter the circuit inductance associated with the winding 45.

It is apparent from the nature of the capacitors 10 and 11 and of the tuning coil 12 that a substantial number of factors must be considered in determining the degree of longitudinal movement of the plunger-type adjustment arms 17 and 18 and the degree of rotational movement of the rotary arm 46 which is required to provide an optimum operating relationship of the reactive elements.

Figures 3, 4:
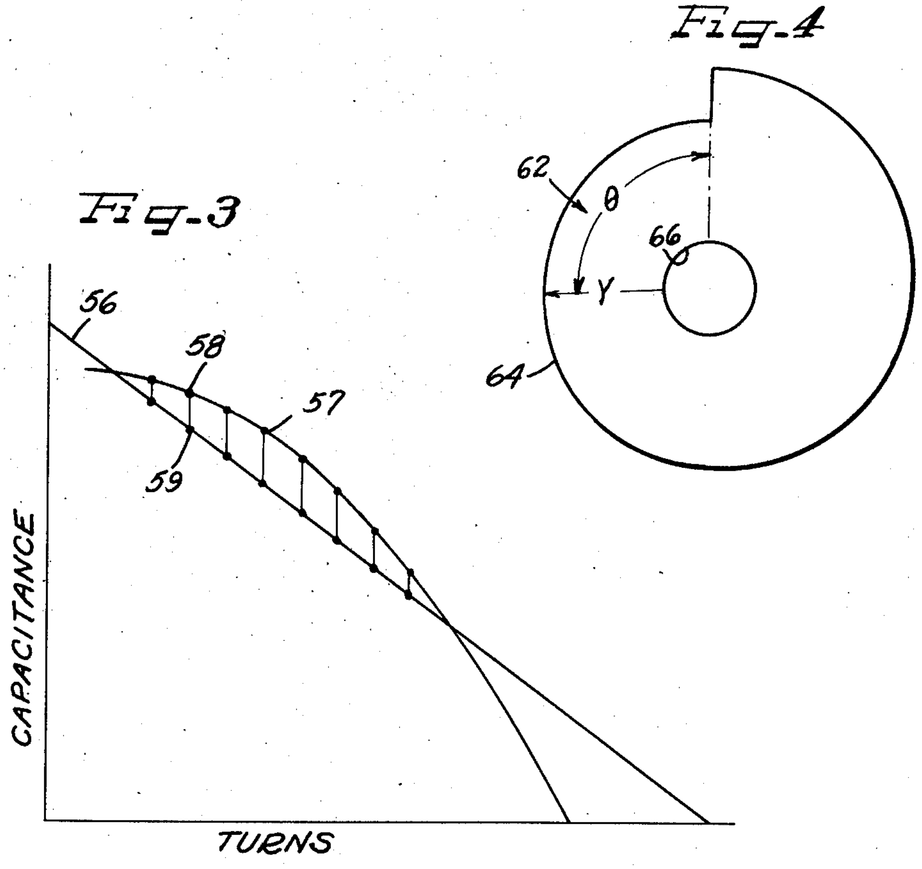
FIG. 3 is a line graph comparing the capacitance obtainable through the use of the drive mechanism of this invention with the capacitance obtainable through previous adjustment devices.
FIG. 4 is an elevated view of a cam profile as employed in the drive mechanism of this invention for adjusting the capacitance of a tuning capacitor to match the inductance of an associated tuning coil.

Various systems have been devised in an attempt to approximate the ideal adjustment of the tunning capacitors required to match the adjustment of the tunning coil. However, such adjustment devices heretofore employed have provided an approrimately linear change in capacitance in response to the rotation of an adjustment shaft. Such an approximation is illustrated in FIG. 3 by the graph 56. The graph shows a linear change in capacitance when platted against the number of rotations of "turns" of an associated adjustment shaft. For example, a screw-type adjustment arm may be provided for the capacitors 10 and 11, and the screw-type arm may be geared to the rotary adjustment arm of the tunning coil 12. The result is that the capacitance and the inductance of the output tuning circuit are mismatched over a considerable portion of the usable frequency spectrum. Assuming the curved graph 57 represents the ideal or catched capacitance required in order to establish an optimum impedance at the output tuning circuit, the degree of mismatch of the capacitive and inductive components can be measured by the distance between the ideal curve 57 as at 58 and the linear response curve as at the point 59. The effect of this mismatch of the capacitance and inductance in the output-tuning circuit is a substantial loss of power due to the presence of a larger-than-optimum impedance at the broadcast frequency. For instance, in a 10 kilowatt transmitter, the mismatch of the capacitive and inductive components of the output-tuning circuit can result in a dissipation of power in the tuning circuit of as much as 3 to 4 kilowatts. In addition to the undesirable effects from an efficiency standpoint, such a loss of power results in the generation of extensive heat in the tuning coil, thereby increasing the cooling requirements of the transmitter. Without the use of cooling fans or a similar water-cooling system, a substantial mismatch between the output tuning coils and capacitors would readily result in the destruction of the coil.

Accordingly, the tuning circuit drive mechanism 13 of FIG. 1 is provided with first and second drive shaft segments 60 and 61, respectively, which are coupled to the capacitors 10 and 11 and to the tuning coil 12 for automatically providing an ideal or matched adjustment of the elements 10, 11 and 12 in response to a given range of selectable broadcast frequencies.

The first drive shaft segment 60 is provided with cam profiles 62 and 63 which are rigidly mounted on the shaft and which have predetermined, contoured surfaces 64 and 65 for bearing against the roller surfaces 29 and 30 of the cam followers 27 and 28. In contrast, the second drive shaft segment 61 is connected directly to the rotary adjustment arm 46 for altering the angular position of that adjustment arm.

The cam profiles are more clearly illustrated in FIG. 4. In FIG. 4, the cam profile 62 is shown to have an inner surface 66 which may be force-fitted about the drive shaft segment 60 for rigidly maintaining the angular relationship of the cam profile 62 and the shaft 60. The contoured surface 64 of the cam profile 62 has a radius Y which varies with the angle Q in such a manner as to adjust the axial position of the plunger-type adjustment arm 17 in order to match the capacitance of the capacitor 10 to the inductance of the tuning coil 12 for all selected broadcast frequencies. That is, for a given rotation on the rotary adjustment arm 46, a given axial movement of the adjustment arm 17 is required to match the reactive components of the output-tuning circuit. Through the use of the cam profile 62, as shown in FIG. 4, the precise axial movement of the adjustment arm 17 is accomplished by keying the radius of the cam profile 62 to the angular movement of the rotary adjustment arm 46.

It is apparent that several revolutions of the adjustment arm 46 may be required to correspond to a single rotation of the cam profile 62 in order to effectively alter the inductance of the tuning coil 12. However, the revolution and rotation rates of the drive shaft segments 60 and 61 can be accommodated through the use of first and second gear assemblies 67 and 68. The gear assemblies 67 and 68 have been connected through respective drive shafts 69 and 70 to a principal drive motor 71. Accordingly, the gear box assemblies 67 and 68 in connection with the drive motor 71 provide the necessary rotation ratio between the drive shaft segments 60 and 61; hence, between the shaft 61 and the cam profile 62. In this way, a single setting of a dial which may be associated with the control of the motor 71 will accomplish an angular movement of the drive shafts 60 and 61 which is properly calibrated together with the cam profile 62 to match the reactive elements of the output tuning circuit for all dial settings. Therefore, by calibrating such a dial in terms of a given frequency range, the apparatus in FIG. 1 becomes an automatic, frequency-adjustable, output-tuning circuit system.

It is apparent that various modifications and combinations of the features of this invention can be accomplished by those versed in the art; however, I desire to claim all such combinations and modifications as properly come within the scope and spirit of my invention.

I claim as my invention:

1. In a radio frequency transmitter an output tuning system comprising:
- a tuning capacitor having a plunger-type adjustment arm, the capacitance of said capacitor being varied by a substantially axial movement of said plunger-type adjustment arm,
- a tuning coil having a rotatably mounted adjustment arm, the inductance of said coil being varied by the angular movement of said rotatably mounted adjustment arm,

- said tuning capacitor and tuning coil being electrically connected to form a tuning output circuit,
- a first drive shaft segment having a cam profile fixedly mounted thereon,
- said cam profile being positioned to ride against the end of said plunger-type adjustment arm and to depress the arm upon rotation of said first drive shaft,
- said cam profile having a plotted cam surface to adjust the capacitance of said capacitor in a non-linear manner to match the inductance of said tuning coil over a wide adjustment range,
- a second drive shaft segment, said second drive shaft segment being connected to said tuning coil and being rotatably linked to said rotatably mounted adjustment arm,
- drive means rotating said first and second drive shaft segments in a constant ratio,
- whereby said plotted cam profile in conjunction with said constant drive ratio maintains a matched condition between said tuning capacitor and tuning coil.

2. A tuning system in accordance with calim 1 wherein a second tuning capacitor is provided similar to said first capacitor and wherein a second cam is provided to adjust said second capacitor and wherein said cam has a plotted profile which is different from the plotted profile of said first cam whereby rotation of said drive means continuously maintains a complex variable relationship of capacitance to capacitance to inductance over wide turning motions of said drive means.

3. A tuning system in accordance with claim 2 wherein ratio means are provided in conjunction with said drive means to operate said second drive shaft at a substantially higher angular speed than said first drive shaft.

References Cited

UNITED STATES PATENTS

| | | | |
|---|---|---|---|
| 1,882,684 | 10/1932 | Achard | 325—171 |
| 2,498,078 | 2/1950 | Harrison | 334—69 |
| 3,090,920 | 5/1963 | Levine | 325—469 |
| 3,260,973 | 7/1966 | Bisnett | 334—69 |

JOHN W. CALDWELL, Primary Examiner

ALBERT J. MAYER, Assistant Examiner

U.S. Cl. X.R.

325—160